(12) United States Patent
Jen et al.

(10) Patent No.: US 6,303,467 B1
(45) Date of Patent: Oct. 16, 2001

(54) METHOD FOR MANUFACTURING TRENCH ISOLATION

(75) Inventors: Yi-Min Jen, Pan-Chiao; Tse-Yi Lu; Ya-Ling Hung, both of Hsin-Chu; Li-Wu Tsao, Taipei, all of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/628,675

(22) Filed: Jul. 28, 2000

(51) Int. Cl.[7] ................................................. H01L 21/76
(52) U.S. Cl. ........................... 438/424; 438/426; 257/506
(58) Field of Search ..................................... 438/424, 426, 438/435; 257/506

(56) References Cited

U.S. PATENT DOCUMENTS

| | | | |
|---|---|---|---|
| 5,137,837 | * | 8/1992 | Chang et al. ........................ 438/154 |
| 5,223,736 | * | 6/1993 | Rodder ................................ 257/506 |
| 5,643,822 | * | 7/1997 | Furukawa et al. .................. 438/421 |
| 5,753,561 | * | 5/1998 | Lee et al. ............................ 438/424 |
| 5,795,811 | * | 8/1998 | Kim et al. ........................... 438/404 |
| 5,960,298 | * | 9/1999 | Kim ..................................... 438/424 |
| 6,069,057 | * | 5/2000 | Wu ...................................... 438/424 |
| 6,074,932 | * | 6/2000 | Wu ...................................... 438/435 |
| 6,130,467 | * | 10/2000 | Bandyopadhyay et al. ........ 257/506 |
| 6,225,659 | * | 5/2001 | Liu ....................................... 257/314 |
| 6,232,203 | * | 5/2001 | Huang ................................. 438/424 |

\* cited by examiner

*Primary Examiner*—Charles Bowers
*Assistant Examiner*—David S Blum

(57) ABSTRACT

A method for manufacturing trench isolation, comprising firstly, defining a trench isolation over the substrate by photolithography and etching technique. Beside, by way of a spacer fabricating process to form a spacer around each of the two sides of the trench isolation. Therefore, a sharp corner in the crossing region between the trench isolation and an active area adjacent thereto in the substrate is smoothed, and the process window for a sequential gate polysilicon etching is improved, as well as the opportunity to leave polysilicon residue in the corner is eliminated. The short circuit between polysilicon gates is also avoided.

16 Claims, 5 Drawing Sheets

METHOD FOR MANUFACTURING TRENCH ISOLATION

BACKGROUND OF THE INVENTION

1. Field of the Invention

The present invention relates to semiconductor manufacturing, and more particularly to a method for manufacturing trench isolation for isolating each element from one another in semiconductor substrate, which can be useful in sub-micron semiconductor manufacturing.

2. Description of the Prior Art

Due to the development of ULSI manufacturing technology, semiconductor manufacturing is improved into the technical level of fabricating integrated circuits with relatively high density. To prevent that semiconductor elements interfere from each other, it is necessary to fabricating effective isolating regions between semiconductor elements, to avoid short circuit among them. However, when semiconductor elements increasingly shrink, the density of integrated circuits is increased, and it is more difficult to fabricating effective and reliable isolation regions to isolate active areas from each other in which semiconductor elements is constituted. It encounters many problems to use the conventional Local Oxidation (LOCOS) method as the isolating regions, such as the formation of bird's beak structure. The bird's beak shape causes unacceptably large encroachment of the field oxide into the active areas. In addition, the planarity of the surface topography attributed to LOCOS is inadequate for sub-micron lithography needs.

Therefore, it is more common to employ trench isolation method such as shallow trench isolation as replacement of LOCOS method, to form trench isolations, which are coplanar with the active areas in the substrate. Typically, a trench is formed by proceeding anisotropically etching in the substrate, depositing a dielectric layer in the substrate to fill it into the trench as isolating material therein, and then planarizing the surface of the dielectric layer by CMP method. Thus, the trench isolations coplanar with adjacent active areas are formed.

Nevertheless, as shown in FIG. 1, the trench isolation method provides "corner effect", that is, there is a sharp corner 1 formed in the crossing region between the trench isolation and the active area. Since after the sequential gate polysilicon layer deposition, the polyslicon layer etching can not attend to the sharp corner. Therefore, it is readily easy to leave polysilicon residue in the sharp corner, and result in short circuit between polysilicon gates.

Accordingly, it is obvious that the conventional method for forming trench isolations is defective and then a mendable method is required, especially in the application of sub-micron semiconductor manufacturing.

SUMMARY OF THE INVENTION

The primary object of the present invention is to provide a method for manufacturing trench isolation, which can smooth a sharp corner in the crossing region between a trench isolation and an active area adjacent thereto in the substrate. Thereby, the polysilicon residue in the corner is eliminated, and short circuit between polysilicon gates is avoided.

Another object of the present invention is to provide a method for manufacturing trench isolation, which can smooth a sharp corner between a trench isolation and an active area adjacent thereto in the substrate, then facilitate sequential deposition and etching of a gate polysilicon layer. Therefore, the process window for the gate polysilicon layer etching is improved.

In order to achieve previous objects of the invention, the present invention provides a method for manufacturing trench isolation, which comprises: providing a substrate; forming a first dielectric material layer over the substrate. Then, defining an isolation region over the substrate by photolithography and etching technique. After that, forming an isolating layer over the substrate having the isolation region, and proceeding anistropically etching to form a spacer around each of the two sides of the isolation region. Then, forming a pad oxide layer over the substrate having the isolation region with spacers formed around. Thereafter, forming a silicon nitride layer over the pad oxide layer. Subsequently, covering a mask over the silicon nitride layer, and performing anisotropically etching in the isolation region to form a trench isolation. Further, forming a second dielectric material layer over the whole substrate to fill the second dielectric material into the trench isolation as isolating material therein; planarizing the second dielectric material layer by chemical mechanical polishing (CMP) method. Finally, removing the pad oxide layer and the silicon nitride layer. A trench isolation with a smooth corner in the crossing region between the trench isolation and an active area adjacent thereto is attained.

BRIEF DESCRIPTION OF THE DRAWINGS

The many aspects and accompanying advantages of the present invention will become more readily appreciated as the same becomes better understood by reference to the following detailed description, when taken in conjunction with the accompanying drawings, wherein.

DESCRIPTION OF THE EMBODIMENTS

Referring to FIGS. 2~9, which illustrates one embodiment of the method for manufacturing trench isolation of the present invention. First, providing a silicon substrate 2, and depositing a pad oxide layer 3 over the substrate 2, with thickness of about 50~500 angstrom. The pad oxide layer 3 can be formed by thermal oxidation method in oxygen-containing atmosphere at temperature of about 800~1100° C. Then, depositing a first silicon nitride layer 4 over the pad oxide layer 3, with thickness of about 500~2000 angstrom. The first silicon nitride layer 4 can be formed by low pressure CVD, plasma enhanced CVD or high density plasma CVD methods, utilizing $SiH_4$, $NH_3$, $N_2$ and $N_2O$ or $SiH_2Cl_2$, $NH_3$, $N_2$ and $N_2O$ as reaction gases. The preferable temperature is 400~500° C. when employing CVD method. While the preferable temperature is 500~800° C. when employing low pressure CVD method. The pad oxide layer 3 is used as a buffer layer between the substrate 2 and the first silicon nitride layer 4 to eliminate stress therebetween.

Figure 1:
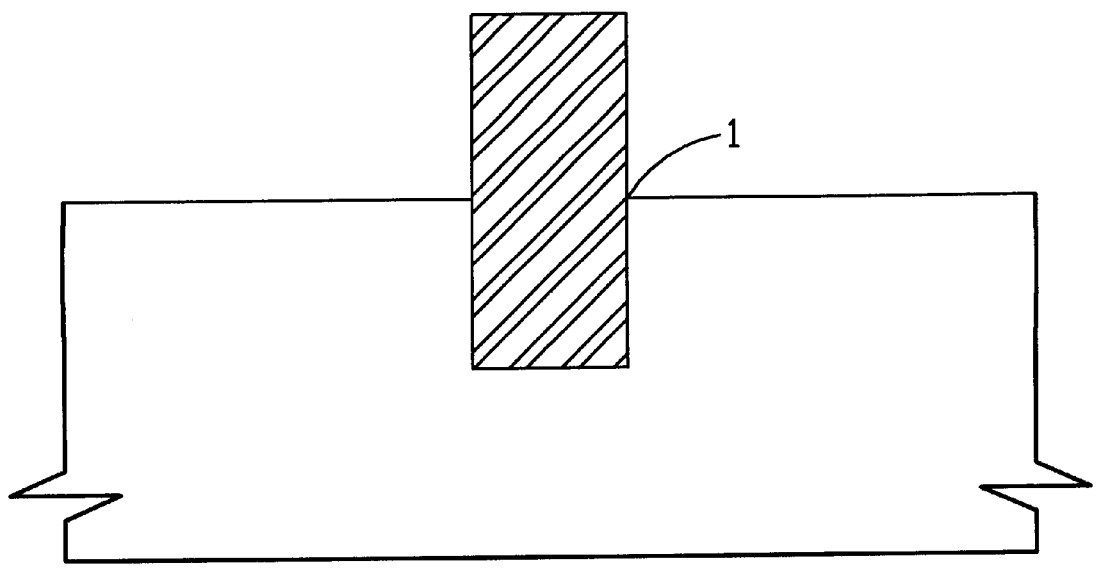
FIG. 1 is a schematic cross-section of a substrate having a trench isolation formed thereon in the prior art.
Figure 2:
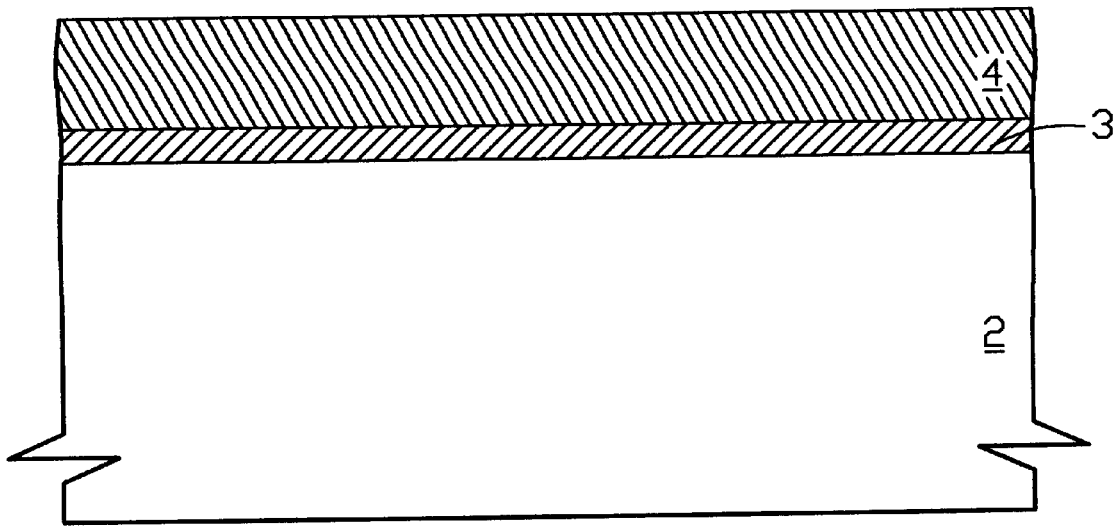
FIG. 2 is a schematic cross-section of a substrate having a first pad oxide and a first silicon nitride layer of the present invention.
Figure 3:
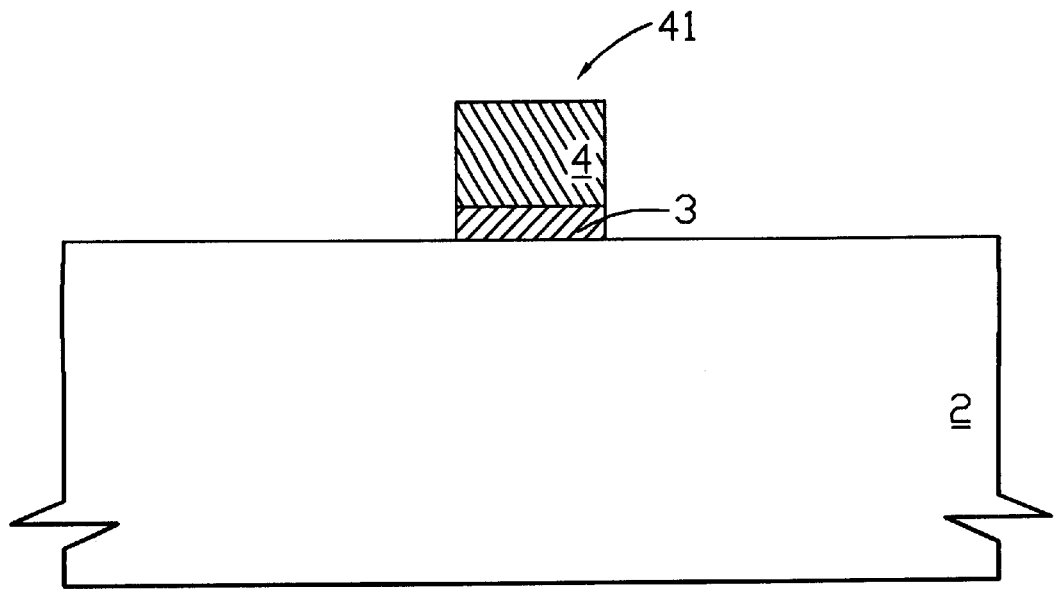
FIG. 3 is a schematic cross-section of the substrate of FIG. 2 having a defined isolation region.
Figure 4:
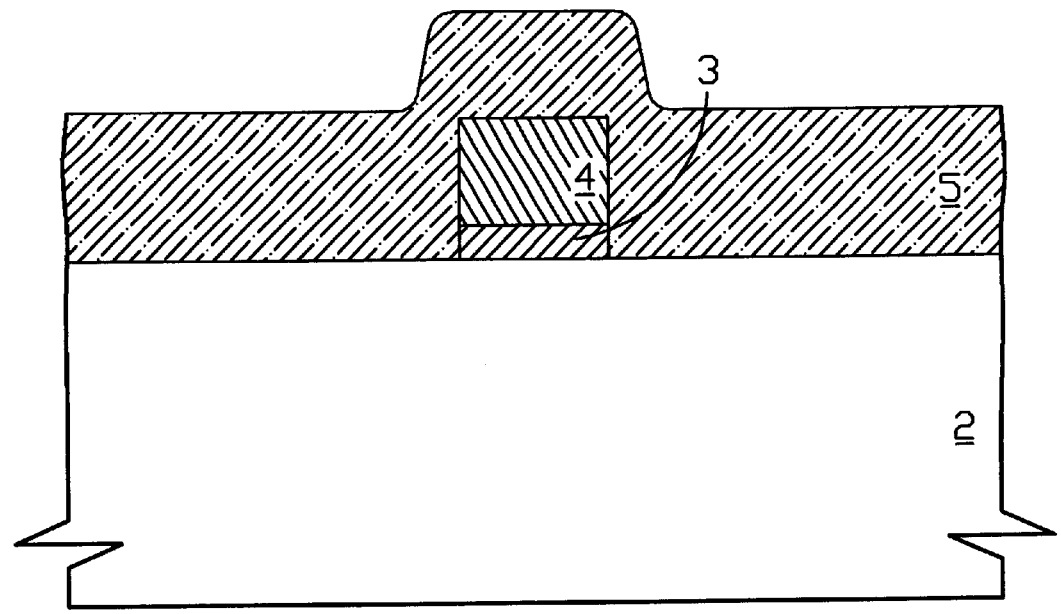
FIG. 4 is a schematic cross-section of the substrate of FIG. 3 over which a first dielectric material layer is deposited thereon.

Referring to FIG. 3, defining an isolation region 41 over the substrate 2 by photolithography and etching technique, for example, by way of covering an anti-diffusion layer mask which is reverse tone with a mask of a diffusion layer over the substrate. Referring to FIG. 4, subsequently, depositing a first dielectric material layer 5 over the whole substrate 2. The first dielectric material layer 5 can be an oxide layer selected from the group consisting of TEOS, silicon nitride with TEOS, BPSG and polysilicon which has been oxidized. Preferably, the first dielectric material layer 5 is an oxide layer formed by CVD method, such as LPCVD-$SiO_2$ utilizing TEOS as reaction gas.

Figure 5:
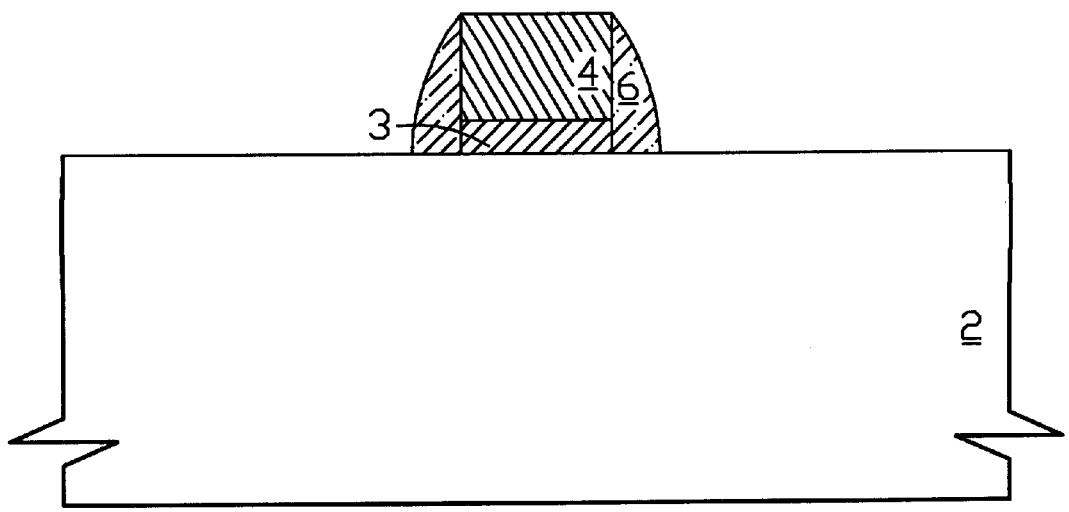
FIG. 5 is a schematic cross-section of the substrate of FIG. 4, having an isolation region with spacers around the two sides thereof.
Figure 6:
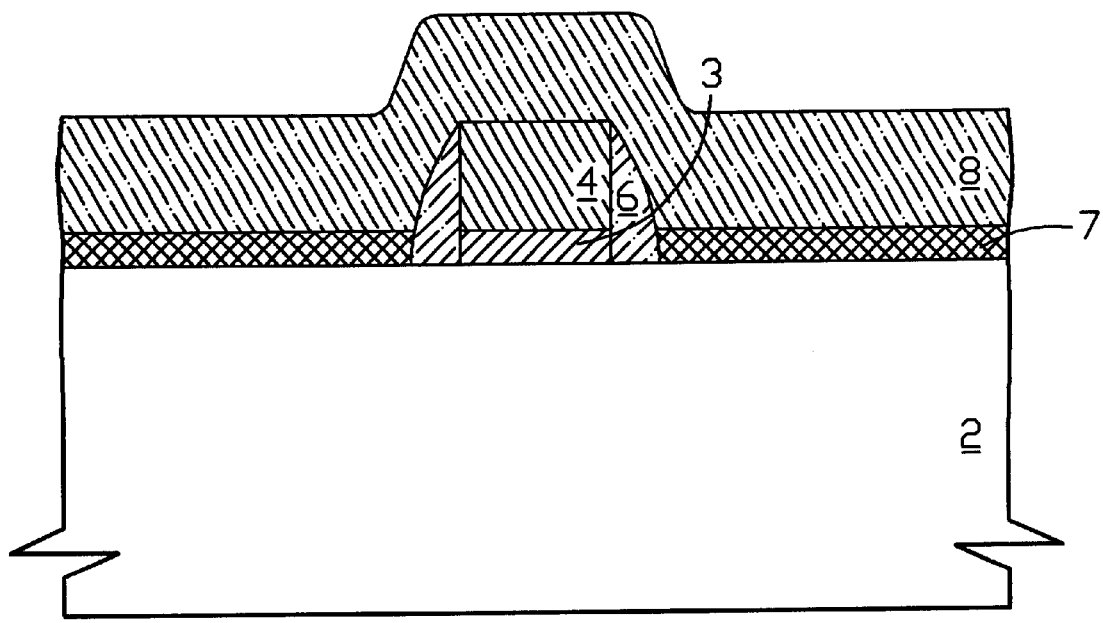
FIG. 6 is a schematic cross-section of the substrate of FIG. 5 over which a second pad oxide layer and a second silicon nitride layer are respectively deposited thereon.

Referring to FIG. 5, proceeding anisotropically etching to form a spacer 6 around each of the two sides of the defined isolation region. The isolation region will have a structure like MOS structure. Preferably, employing partial spacer dry etch to form the spacer 6 to avoid damage of active areas of the substrate 2. Referring to FIG. 6, thereafter, depositing a second pad oxide layer 7 over the substrate 2, with thickness of about 50~500 angstrom. The second pad oxide layer 7 can be a $SiO_2$ layer formed by plasma enhanced CVD method. Then, depositing a second silicon nitride layer 8 over the second pad oxide layer 7, with thickness of about 500~2000 angstrom. The second silicon nitride layer 8 can be formed by low pressure CVD, plasma enhanced CVD or high density plasma CVD methods, utilizing $SiH_4$, $NH_3$, $N_2$ and $N_2O$ or $SiH_2Cl_2$, $NH_3$, $N_2$ and $N_2O$ as reaction gases, at temperature of 400~800° C. The preferable temperature is 400~500° C. when employing CVD method. While the preferable temperature is 500~800° C. when employing low pressure CVD method. The second pad oxide layer 7 is used as a buffer layer between the substrate 2 and the second silicon nitride layer 8 to eliminate stress therebetween. While the second silicon nitride layer 8 is used as a stop layer for a subsequent second dielectric material layer when planarized by chemical mechanical polishing (CMP) method.

Figure 7:
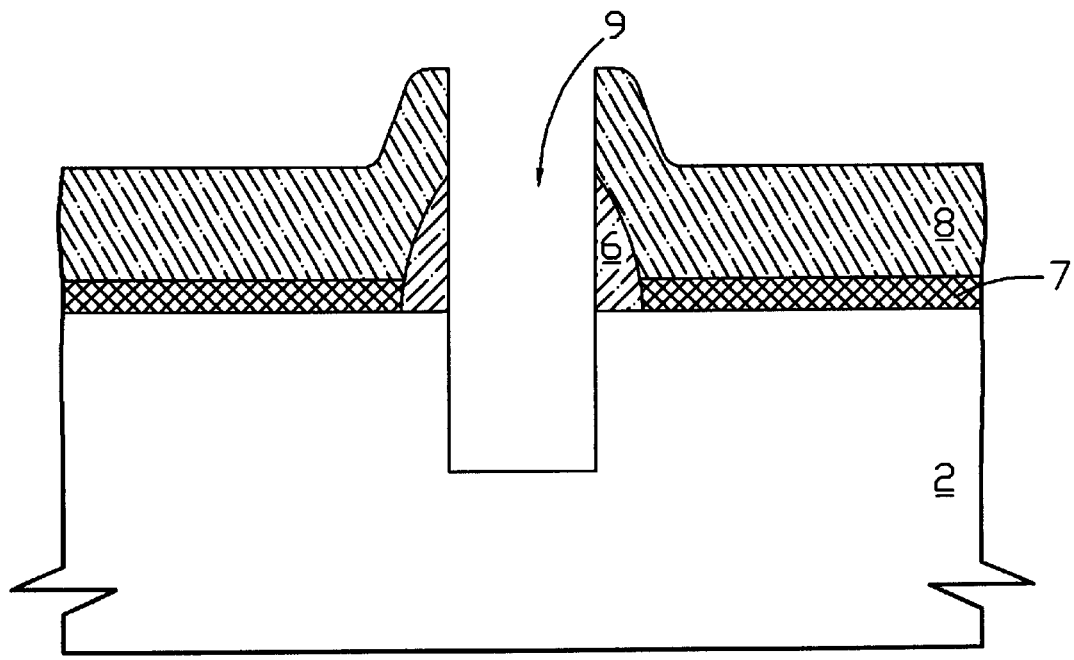
FIG. 7 is a schematic cross-section of the substrate of FIG. 6 having a trench isolation formed thereon.

Referring to FIG. 7, thereafter, covering a mask over the second silicon nitride layer 8, and performing anistropically dry etching in the isolation region 41 to form a trench isolation 9 without isolating material therein. For example, the trench isolation 9 can be formed by performing sputtering etch or reactive ion etch in the isolation region, utilizing $CHF_3$, $C_2F_6$, $C_3F_8$ or $CF_4$ as reaction gas. Preferably, the width of the trench isolation 9 is larger than about 0.3 $\mu$m, and the depth of the trench isolation 9 is about 3000~5000 angstrom.

Figure 8:
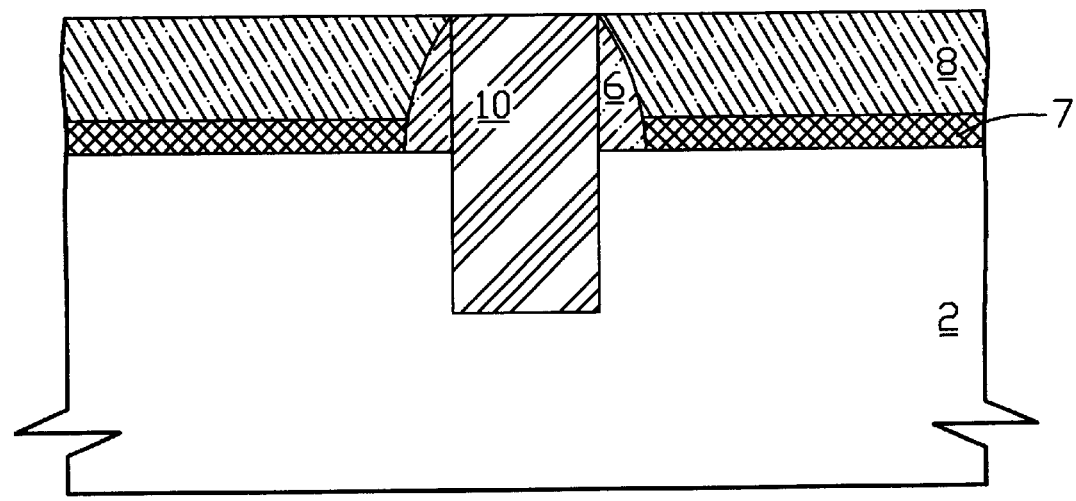
FIG. 8 is a schematic cross-section of the substrate of FIG. 7, in which an isolating material is filled into the trench region.

Referring to FIG. 8, subsequently, depositing a second dielectric material layer 10 over the substrate 2 having the trench isolation 9 formed thereon, to fill the second dielectric material into the trench isolation 9 to form a trench isolation 12 with isolating material therein. The second dielectric material layer 10 can be an oxide layer formed by plasma enhanced CVD or low pressure CVD method, such as TEOS, silicon nitride with TEOS, BPSG, or polysilicon which has been oxidized. Preferably, the second dielectric material layer 10 is $O_3$-TEOS layer formed at temperature of 400~800° C., and subject to thermal treatment for about 30~130 minutes at temperature of about 950~1050° C., to density the isolating material in the trench isolation 12. Then, planarizing the second dielectric material layer 10 by chemical mechanical polishing (CMP) method, which stopping at the second silicon nitride layer 8.

Figure 9:
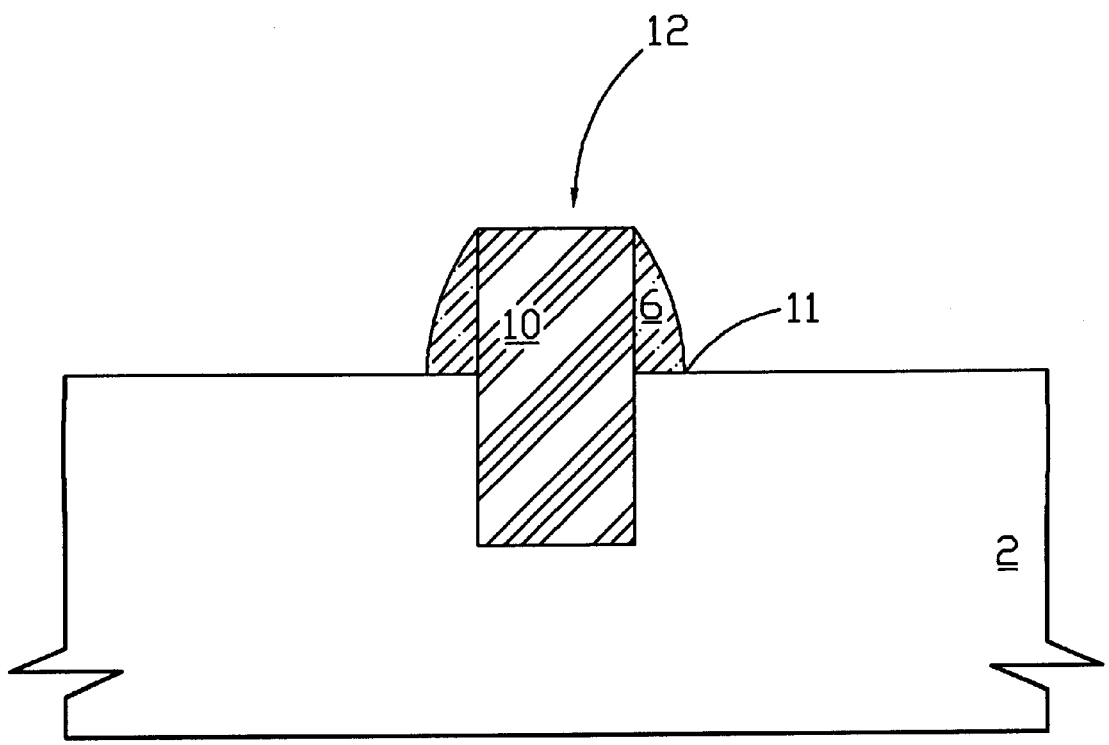
FIG. 9 is a schematic cross-section of the substrate of the present invention having a trench isolation with a smooth corner in the crossing region between the trench isolation and an active area adjacent thereto.

Referring to FIG. 9, finally, sequentially removing the second silicon nitride layer 8 and the second pad oxide layer 7 to obtain a trench isolation having a smooth corner in the crossing region between the trench isolation 12 and an active area adjacent thereto in the substrate 2. The second silicon nitride layer 8 can be removed by wet etching with phosphoric acid solution heating to 180° C. The second pad oxide layer 7 can be removed by wet etching with hydrofluoric acid/ammonium fluoride solution. Alternatively, the second silicon nitride layer 8 and the second pad oxide layer 7 can be removed by sputtering etch or reactive ion etch, utilizing $CHF_3$, $C_2F_6$, $C_3F_8$ or $CF_4$ as reaction gas.

In another embodiment of the present invention, first depositing a first dielectric material layer over a silicon substrate. Then, defining an isolation region by photolithography and etch technique, for example, by way of covering an anti-diffusion layer mask which is reverse tone with a mask of a diffusion layer over the substrate. Thereafter, depositing an isolating layer over the substrate having the isolation region formed thereon. The isolating layer can be an oxide layer formed by TEOS, silicon nitride with TEOS, BPSG and polysilicon which has been oxidized. Preferably, the isolating layer is an oxide layer formed by CVD method, such as LPCVD-$SiO_2$, utilizing TEOS as reaction gas. Then, proceeding anisotropically etching to form a spacer around each of the two sides of the defined isolation region. Preferably, the spacer is formed by partial spacer dry etch, to avoid damage of active areas in the substrate.

Subsequently, depositing a pad oxide layer over the substrate having the isolating region with spacers formed around. The pad oxide layer can be a $SiO_2$ layer formed by plasma enhanced CVD. Then, depositing a silicon nitride layer over the pad oxide layer. The silicon nitride layer can be formed by low pressure CVD, plasma enhanced CVD or high density plasma CVD at temperature of 400~800° C., utilizing $SiH_4$, $NH_3$, $N_2$ and $N_2O$ or $SiH_2Cl_2$, $NH_3$, $N_2$ and $N_2O$ as reaction gas. The preferable temperature is 400~500° C. when employing CVD method. While the preferable temperature is 500~800° C. when employing low pressure CVD method. The pad oxide layer is used as a buffer layer between the substrate and the silicon nitride layer to eliminate stress therebetween. While the silicon nitride layer is used as a stop layer for a subsequent second dielectric material layer when planarized by chemical mechanical polishing (CMP) method.

Subsequently, covering a mask over the silicon nitride layer, and performing anisotropically etch in the isolation region to form a trench isolation. For example, the trench isolation can be formed by sputtering etch or reactive ion etch, utilizing $CHF_3$, $C_2F_6$, $C_3F_8$ or $CF_4$ as reaction gas. Preferably, the width of the trench isolation is larger than about 0.3 $\mu$m, and the depth of the trench isolation is about 3000~5000 angstrom.

Then, depositing a second dielectric material layer over the substrate having the trench isolation formed thereon, to fill the second dielectric material into the trench isolation as isolating material therein. The second dielectric material layer can be an oxide layer formed by plasma enhanced CVD or low pressure CVD, such as TEOS, BPSG, silicon nitride with TEOS or polysilicon which has been oxidized. Preferably, the second dielectric material layer is $O_3$-TEOS layer formed at temperature of 400~800° C., and subject to thermal treatment about 30~130 minutes at temperature of 950~1050° C., to density the isolating material in the trench isolation. Then, planarizing the second dielectric material layer by chemical mechanical polishing method, which stopping at the silicon nitride layer.

Finally, sequentially removing the silicon nitride layer and pad oxide layer to obtain a trench isolation with a smooth corner in the crossing region between the trench isolation and an active region adjacent thereto in the substrate. The silicon nitride layer can be wet etched by employing phosphoric acid heating to 180° C., and the pad oxide layer can be wet etched by utilizing mixture of HF/NH$_4$F solutions. Otherwise, the silicon nitride layer and pad oxide layer can be removed by sputtering etch or reactive ion etch, utilizing CHF$_3$, C$_2$F$_6$, C$_3$F$_8$ or CF$_4$ as reaction gas.

To sum up the foregoing, the method for manufacturing novel trench isolation of the present invention is covering an anti-diffusion layer mask which is reverse tone with the mask of a diffusion layer over the substrate, and defining a trench isolation by photolithography and etching technique. Beside, by way of a spacer fabricating process to form a spacer around each of the two sides of the trench isolation. Thereby, the sharp corner in the crossing region between the trench isolation and an active area adjacent thereto in the substrate is smoothed. Therefore, the process window for etching the sequential gate polysilicon is improved, and the opportunity to leave polysilicon residue in the corner is eliminated, as well as the short circuit between polysilicon gates is avoided.

While this invention has been described with reference to illustrative embodiments, this description is not intended to be construed in a limiting sense. Various modifications and revisions of the illustrative embodiments, as well as other embodiments of the invention, will be apparent to persons skilled in the art upon reference to the description. It is therefore intended that the appended claims encompass any such modifications or embodiments.

What is claimed is:

1. A method for manufacturing trench isolation, said method comprises following steps:

providing a silicon substrate;

forming a first dielectric material layer over said substrate;

defining an isolation region over said substrate by photolithography and etching technique;

forming a first isolating layer over said substrate having said isolation region;

proceeding anisotropically etching to form a spacer around each of the two sides of said isolation region;

forming a pad oxide layer over said substrate having said isolation region with said spacers formed around;

forming a silicon nitride layer over said pad oxide layer;

covering a mask over said silicon nitride layer, and proceeding anistropically etching in said isolation region to form a trench isolation;

forming a second dielectric material layer over said whole substrate, thereby fill said second dielectric material into said trench isolation as isolating material therein;

planarizing said second dielectric material layer by chemical mechanical polishing method; and removing said second pad oxide layer and said second silicon nitride layer to form a trench isolation with a smooth corner in the crossing region between said trench isolation and said active area in said substrate.

2. The method according to claim 1, wherein said first dielectric material layer is formed from a material selecting from the group consisting of TEOS, silicon nitride with TEOS, BPSG and polysilicon having been oxidized.

3. The method according to claim 1, wherein said second dielectric material layer is formed from a material selecting from the group consisting of TEOS, silicon nitride with TEOS, BPSG and polysilicon having been oxidized.

4. The method according to claim 1, wherein said second dielectric material layer comprises O$_3$-TEOS.

5. The method according to claim 4, wherein said O$_3$-TEOS of said second dielectric material layer is formed at temperature of 400~480° C., and subject to thermal treatment about 30~130 minutes at temperature of 950~1050° C.

6. The method according to claim 1, wherein said spacer is formed by partial spacer dry etching method.

7. A method for manufacturing trench isolation, said method comprises following steps:

providing a silicon substrate;

forming a first pad oxide layer over said substrate;

forming a first silicon nitride layer over said first pad oxide layer;

defining an isolation region over said substrate by photolithography and etching technique;

forming a first dielectric material layer over said substrate having said isolation region;

proceeding anisotropically etching to form a spacer around each of the two sides of said isolation region;

forming a second pad oxide layer over said substrate having said isolation region with said spacers formed around;

forming a second silicon nitride layer over said second pad oxide layer;

covering a mask over said second silicon nitride layer, and proceeding anistropically etching in said isolation region to form a trench isolation;

forming a second dielectric material layer over said whole substrate, thereby fill said second dielectric material into said trench isolation as isolating material therein;

planarizing said second dielectric material layer by chemical mechanical polishing method; and removing said second pad oxide layer and second silicon nitride layer to form a trench isolation with a smooth corner in the crossing region between said trench isolation and said active area in said substrate.

8. The method according to claim 7, wherein said first pad oxide layer comprises SiO$_2$.

9. The method according to claim 8, wherein said first pad oxide layer is formed by thermal oxidation method in oxygen-containing atmosphere at temperature of about 800~1100° C.

10. The method according to claim 7, wherein said spacer is formed by partial spacer dry etching method.

11. The method according to claim 7, wherein said second pad oxide layer comprises SiO$_2$.

12. The method according to claim 11, wherein said second pad oxide layer is formed by thermal oxidation method in oxygen-containing atmosphere at temperature of 800~1100° C.

13. The method according to claim 7, wherein said first dielectric material layer is formed from a material selecting from the group consisting of TEOS, silicon nitride with TEOS, BPSG and polysilicon having been oxidized.

14. The method according to claim 7, wherein said second dielectric material layer is formed from a material selecting from the group consisting of TEOS, silicon nitride with TEOS, BPSG and polysilicon having been oxidized.

15. The method according to claim 7, wherein said second dielectric material layer comprises O$_3$-TEOS.

16. The method according to claim 15, wherein said O3-TEOS of said second dielectric material layer is formed at temperature of 400~480° C., and subject to thermal treatment about 30~130 minutes at temperature of 950~1050° C.

* * * * *